(12) United States Patent
Moriyama et al.

(10) Patent No.: US 10,157,768 B2
(45) Date of Patent: Dec. 18, 2018

(54) SUBSTRATE PROCESSING APPARATUS, TRANSFER METHOD, AND SUSCEPTOR

(71) Applicant: NuFlare Technology, Inc., Kanagawa (JP)

(72) Inventors: Yoshikazu Moriyama, Shizuoka (JP); Naohisa Ikeya, Kanagawa (JP); Kunihiko Suzuki, Shizuoka (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 15/714,511

(22) Filed: Sep. 25, 2017

(65) Prior Publication Data

US 2018/0090364 A1 Mar. 29, 2018

(30) Foreign Application Priority Data

Sep. 26, 2016 (JP) ................. 2016-186897

(51) Int. Cl.
*H01L 21/687* (2006.01)
*C23C 16/458* (2006.01)
*C23C 16/44* (2006.01)
*H01L 21/67* (2006.01)

(52) U.S. Cl.
CPC .... *H01L 21/68742* (2013.01); *C23C 16/4401* (2013.01); *C23C 16/4584* (2013.01); *H01L 21/68735* (2013.01); *H01L 21/68792* (2013.01); *H01L 21/67069* (2013.01)

(58) Field of Classification Search
CPC .................................................. H01L 21/687
See application file for complete search history.

(56) References Cited

U.S. PATENT DOCUMENTS

| | | | |
|---|---|---|---|
| 2003/0209325 A1* | 11/2003 | Yu ...................... | H01L 21/68728 156/345.51 |
| 2004/0031338 A1* | 2/2004 | Chen ................. | H01L 21/68742 73/865.9 |
| 2005/0155823 A1* | 7/2005 | Hiroki ............... | H01L 21/68742 187/401 |
| 2009/0209112 A1* | 8/2009 | Koelmel ........... | H01L 21/68742 438/795 |

(Continued)

FOREIGN PATENT DOCUMENTS

| | | |
|---|---|---|
| JP | 06-275531 | 9/1994 |
| JP | 11-029392 | 2/1999 |

(Continued)

*Primary Examiner* — Gerald McClain
(74) *Attorney, Agent, or Firm* — Rankin, Hill & Clark LLP

(57) ABSTRACT

An apparatus of an embodiment includes: a processing-chamber; a susceptor capable of supporting a substrate, the susceptor including a first member having an opening in a central portion, and a second member covering the opening; a support configured to support and rotate the susceptor in the processing-chamber; and a lift disposed in the support, and capable of moving up and down at least one of the first member and the second member, wherein the support is capable of rotating the susceptor to have predefined phases with respect to the lift, and when the lift moves up, the lift is brought into contact with the first member if the susceptor is in a first phase, and the lift is brought into contact with the second member if the susceptor is in a second phase that is different from the first phase.

10 Claims, 9 Drawing Sheets

(56) References Cited

U.S. PATENT DOCUMENTS

| | | | | |
|---|---|---|---|---|
| 2009/0296774 A1* | 12/2009 | Koelmel | ........... | H01L 21/67248 374/121 |
| 2012/0234243 A1* | 9/2012 | Olgado | ............. | H01L 21/68742 118/730 |
| 2017/0084475 A1* | 3/2017 | Wagner | ............. | H01L 21/68707 |
| 2017/0287769 A1* | 10/2017 | Ota | ................... | H01L 21/68742 |
| 2018/0090364 A1* | 3/2018 | Moriyama | ........ | H01L 21/68742 |

FOREIGN PATENT DOCUMENTS

| | | | | |
|---|---|---|---|---|
| JP | 2010-028098 | | 2/2010 | |
| JP | 2010028098 A | * | 2/2010 | ......... C23C 16/4401 |

* cited by examiner

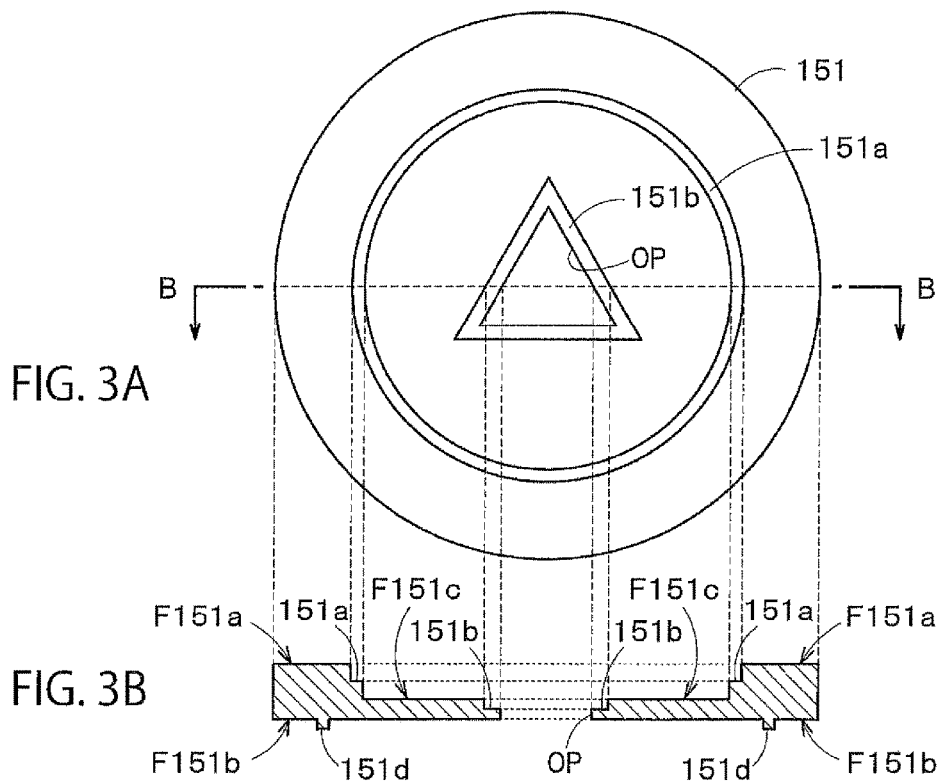
FIG. 3A
FIG. 3B
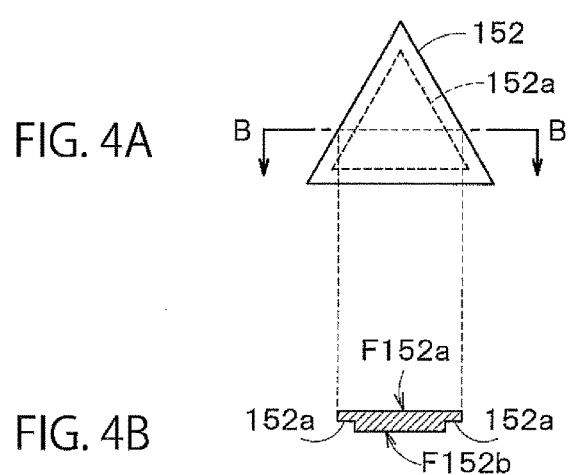
FIG. 4A
FIG. 4B

SUBSTRATE PROCESSING APPARATUS, TRANSFER METHOD, AND SUSCEPTOR

CROSS REFERENCE TO RELATED APPLICATIONS

This application is based upon and claims the benefit of priority from the prior Japanese Patent Application No. 2016-186897, filed on Sep. 26, 2016, the entire contents of which are incorporated herein by reference.

FIELD

The embodiments of the present invention relate to a substrate processing apparatus, a transfer method, and a susceptor.

BACKGROUND

In substrate processing apparatuses using a gas phase reaction such as film deposition apparatuses or etching apparatuses, a substrate is transferred to a processing chamber, placed on a susceptor, processed, and transferred out of the processing chamber. Since a film may be formed also on the susceptor or the susceptor may be damaged during the processing, the susceptor needs maintenance works such as cleaning and coating at predetermined intervals.

If the maintenance works cannot be performed in the processing chamber, however, the susceptor needs to be taken out for the cleaning. If the processing chamber is open to the air to take out the susceptor, the throughput is considerably reduced. The susceptor therefore is preferably transferred in a manner similar to the transfer of the substrate. A mechanism for lifting up and down the substrate for the transfer, however, selectively lifts up and down the substrate, and therefore cannot be used to further transfer the susceptor after the substrate is taken out. Thus, another mechanism needs to be provided.

If the maintenance is performed at frequent intervals, the substrate together with the susceptor is taken out of the processing chamber, and after the substrate is removed, the maintenance of the susceptor is performed. In this case, the substrate needs to be placed on the susceptor or removed from the susceptor outside the processing chamber. The maintenance, however, is not needed to be performed after every processing operation.

SUMMARY

A substrate processing apparatus according to an embodiment includes: a processing chamber; a susceptor capable of supporting a substrate in the processing chamber, the susceptor including a first member having an opening in a central portion, and a second member covering the opening; a support configured to support and rotate the susceptor in the processing chamber; and a lift disposed in the support, and capable of moving up and down at least one of the first member and the second member, wherein the support is capable of rotating the susceptor to have predefined phases with respect to the lift, and when the lift moves up, the lift is brought into contact with the first member if the susceptor is in a first phase, and the lift is brought into contact with the second member if the susceptor is in a second phase that is different from the first phase.

When the susceptor is in the first phase, the lift may move up or down the first member, or the first member together with the second member, and when the susceptor is in the second phase, the lift may move up or down the second member.

The lift may include a plurality of protrusions extending in a first direction substantially perpendicular to a substrate mounting surface of the susceptor and being disposed to be rotationally symmetric around a rotational center of the susceptor; and the lift may move up at least one of the first member and the second member by the protrusions by moving the protrusions in the first direction.

The lift may include protrusions that are brought into contact with the first member or the second member when the lift moves up; and a circle passing through points in each of the protrusions may include first arcs overlapping the first member and second arcs overlapping the second member.

When the protrusions are below the first arcs, the protrusions may be brought into contact with the first member without being in contact with the second member; and when the protrusions are below the second arcs, the protrusions may be brought into contact with the second member without being in contact with the first member.

When the susceptor rotates relative to the lift, the protrusions may alternately pass through portions below the first arcs and portions below the second arcs.

A shape formed by connecting apexes of the protrusions may be substantially similar to a shape of the opening, and smaller than the opening.

The number of protrusions may be three; and the opening may have a substantially triangular shape.

A transfer method according to an embodiment transfers a substrate to be placed and processed on a susceptor in a processing chamber, the susceptor includes a first member having an opening in a central portion and a second member covering the opening, and is supported by a support, the transfer method includes: transferring the susceptor into the processing chamber to have a first phase with respect to a lift disposed in the support, moving up the lift to place the susceptor on the lift, and lowering the lift to place the susceptor on the support; rotating the susceptor to have a second phase relative to the lift, the second phase being different from the first phase; and after transferring the substrate into the processing chamber, moving up the second member together with the lift to place the substrate on the second member, and lowering the lift to place the substrate and the second member on the first member.

When the susceptor is transferred, the lift may move up both the first member and the second member from the support; and when the substrate is transferred, the lift may move up the second member together with the substrate from the first member and the support.

A susceptor according to an embodiment is capable of supporting a substrate in a processing chamber, the susceptor includes: a first member having an opening in a central portion; and a second member covering the opening, wherein a circle having a predefined diameter, a center of which is a rotational center of the susceptor, overlaps the first member in a first phase, and the second member in a second phase that is different from the first phase.

When a lift moves up the susceptor from below first arcs of the circle overlapping the first member, both the first member and the second member may be moved up, and when the lift moves up the susceptor from below second arcs of the circle overlapping the first member, the second member may be lifted from the first member.

The second member may have a shape substantially similar to a shape of the opening.

Shapes of the second member and the opening are substantially triangular.

BRIEF DESCRIPTION OF THE DRAWINGS

FIGS. 3A and 3B are a plan view and a cross-sectional view showing an example of the structure of a first member of the susceptor;

FIGS. 4A and 4B are a plan view and a cross-sectional view showing an example of a second member of the susceptor;

DETAILED DESCRIPTION

Embodiments will now be explained with reference to the accompanying drawings. The present invention is not limited to the embodiments.

First Embodiment

Figure 1:
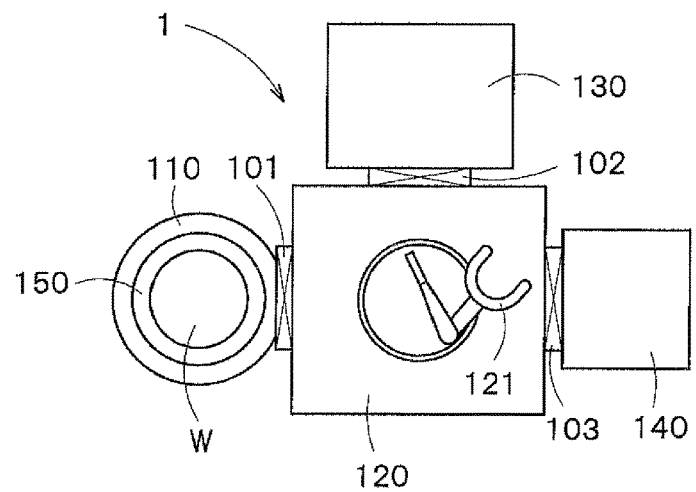
FIG. 1 is a schematic plan view showing an example of a structure of a substrate processing apparatus according to a first embodiment.

FIG. 1 is a schematic plan view showing an example of the structure of a film deposition apparatus (this may be simply referred to as "apparatus" hereinafter), which is an example of a substrate processing apparatus according to a first embodiment.

The apparatus 1 includes a film deposition chamber 110 served as a processing chamber in which films are formed on a substrate W, a transfer chamber 120 through which the substrate W is transferred, a susceptor chamber 130, and a load lock chamber 140. The film deposition chamber 110, the susceptor chamber 130, and the load lock chamber 140 are disposed around the transfer chamber 120, and in communication with the transfer chamber 120 so as to mutually send and receive the substrate W via the transfer chamber 120.

The transfer chamber 120 includes a transfer mechanism 121. The transfer mechanism 121 transfers the substrate W that is transferred into the load lock chamber 140 from the outside of the apparatus 1 to the film deposition chamber 110 via the transfer chamber 120. After the substrate W is processed, the transfer mechanism 121 takes the substrate W out of the film deposition chamber 110, and transfers the substrate W to the load lock chamber 140 via the transfer chamber 120.

For example, the transfer mechanism 121 is a robot arm capable of moving an arm and/or the substrate W in a substantially horizontal or substantially vertical direction. More than one robot arm may be provided.

A transfer passage 101 is disposed at a connecting portion connecting the film deposition chamber 110 and the transfer chamber 120. The transfer passage 101 includes a gate valve (not shown) disposed between the film deposition chamber 110 and the transfer chamber 120, the gate valve being capable of hermetically sealing the film deposition chamber 110 and the transfer chamber 120. The gate valve may open and close the passage between the film deposition chamber 110 and the transfer chamber 120. A transfer passage 103 is disposed at a connecting portion connecting the load lock chamber 140 and the transfer chamber 120. The transfer passage 103 includes a gate valve disposed between the load lock chamber 140 and the transfer chamber 120, the gate valve being capable of hermetically sealing the load lock chamber 140 and the transfer chamber 120. The gate valve may open and close the passage between the load lock chamber 140 and the transfer chamber 120. Due to this structure, the transfer mechanism 121 of the transfer chamber 120 may transfer the substrate W from the transfer chamber 120 to any of the film deposition chamber 110, the susceptor chamber 130, and the load lock chamber 140 via the transfer passage 101, 102, or 103. The transfer passages 101 to 103 may have the same structure.

The film deposition chamber 110, the transfer chamber 120, and the susceptor chamber 130 are, for example, under an Ar atmosphere, and controlled to be under a predefined pressure by a pressure regulating valve and a vacuum pump that are not shown.

The substrate W is a semiconductor substrate such as a silicon substrate, a SiC substrate, or a GaAs substrate. The substrate W, however, is not limited to a semiconductor substrate but may be a substrate of other materials.

The substrate W may be placed on a susceptor 150, heated, and rotated inside the film deposition chamber 110. A processing gas is supplied to the film deposition chamber 110. As a result, a desired film is formed on the substrate W or a film on the substrate W or the substrate W itself is etched in the film deposition chamber 110. In this embodiment, the apparatus 1 is, for example, a film deposition apparatus of a single-wafer-processing type, which processes one substrate W at a time. Thus, the film deposition chamber 110 receives one substrate at a time for performing a film-deposition process. A more detailed structure of the film deposition chamber 110 will be described later with reference to FIG. 2.

The susceptor chamber 130 houses susceptors. A plurality of susceptors may be replaceably stored in the susceptor chamber 130, or a susceptor to be taken out of the apparatus 1 may be temporarily housed in the susceptor chamber 130. The load lock chamber 140 is disposed to send and receive the substrate W between the inside and the outside of the apparatus 1. Specifically, the load lock chamber 140 puts the substrate W into the apparatus 1 from the outside and takes the substrate W from the apparatus 1 to the outside. The pressure of the load lock chamber 140 is reduced to the same level as the transfer chamber 120, and thereafter the substrate W in the load lock chamber 140 is put into the transfer chamber 120 via the transfer passage 103. In another operation, the load lock chamber 140 is opened to the air after the substrate W is housed, and then the substrate W is taken out of the apparatus 1.

The apparatus 1 shown in FIG. 1 includes one film deposition chamber 110. The apparatus 1, however, may have a plurality of film deposition chambers 110. This allows the apparatus 1 to process a plurality of substrates W in parallel.

Figure 2:
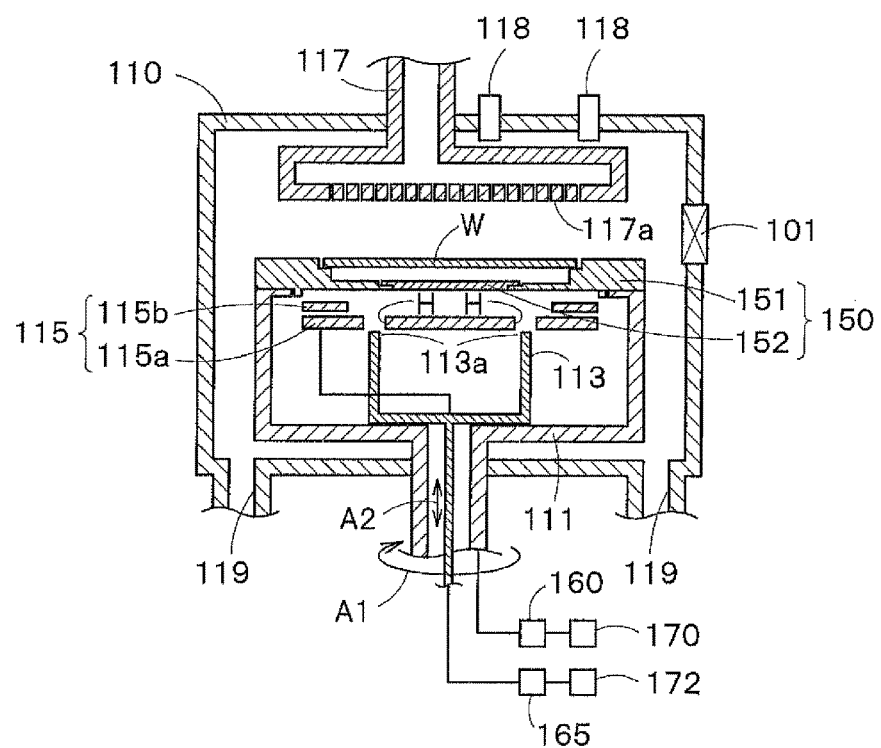
FIG. 2 is a cross-sectional view showing an example of the structure of the film deposition chamber.

FIG. 2 is a cross-sectional view showing an example of the structure of the film deposition chamber 110. The film deposition chamber 110 includes a support 111, a lift 113, a heater 115, a gas supply part 117, radiation thermometers 118, an evacuation part 119, a rotating mechanism 160, a driving mechanism (driver) 165, and controllers 170 and 172. Each of the controllers may be implemented in either hardware including electric circuits (circuitry) or software. When implemented in software, a program that realizes at least part of functions of the controller 170 and 172 may be stored on a recording medium such as a flexible disk or CD-ROM and read and executed by a computer including electric circuits (circuitry). As described above, the film deposition chamber 110 is connected to the transfer chamber 120 shown in FIG. 1 by the transfer passage 101. The substrate W or the susceptor may be put into or taken out of the transfer chamber 120 via the transfer passage 101.

The support 111 is substantially cylindrical, and may be rotated in a direction indicated by an arrow A1, for example, around a rotation axis that is perpendicular to a horizontal section of the support 111, and located at a center of the horizontal section. The support 111 is connected to the rotating mechanism 160, and rotated and driven by the rotating mechanism 160. The rotating mechanism 160 is controlled by the controller 170. The support 111 is formed of a heat-resistant material such as SIC. The susceptor 150 may be placed on the support 111, and the substrate W may be placed on the susceptor 150. Thus, the support 111 supports and rotates the susceptor 150 and the substrate W in the film deposition chamber 110. The structure of the susceptor 150 will be described later with reference to FIGS. 3A to 4B.

The heater 115 is disposed inside the support 111. The heater 115 is located below the substrate W and the susceptor 150 and capable of heating the substrate W via the susceptor 150. The heater 115 includes an in-heater 115a and an out-heater 115b. The in-heater 115a heats the entire part of the substrate W, and the out-heater 115b mainly heats edge portions of the substrate W where the temperature tends to decrease. The in-heater 115a has holes H that prevent the in-heater 115a from contacting protrusions (push-up pins) 113a of the lift 113. An upper heater (not shown) may also be disposed on a side surface of the film deposition chamber 110 above the substrate W. This allows the substrate W to be heated from above and below.

The lift 113 includes a plurality of protrusions 113a. The protrusions 113a extend in a direction A2 (substantially vertical direction) that is substantially perpendicular to a substrate mounting surface of the susceptor 150. The lift 113 is connected to and driven by the driving mechanism 165. The driving mechanism 165 is controlled by the controller 172 to move up and down in the direction A2 that is substantially perpendicular to the substrate mounting surface of the susceptor 150. While the substrate W is being processed, the lift 113 is located below the heater 115 as shown in FIG. 2. When the substrate W or the susceptor 150 is transferred, the lift 113 moves up to lift the susceptor 150 or the substrate W from the support 111 by means of the protrusions 113a. Since the in-heater 115a has the holes H, the protrusions 113a of the lift 113 penetrate the holes H of the in-heater 115a when the lift 113 moves up so as to hold up the bottom of the susceptor 150 without being in contact with the in-heater 115a.

The gas supply part 117 is disposed in an upper portion of the film deposition chamber 110, and supplies a film-forming gas via a shower plate 117a. The shower plate 117a has a number of supply holes on a surface facing the substrate W. The film-forming gas is supplied through the supply holes toward the substrate W. A desired film may be formed on the surface of the substrate W in this manner.

The radiation thermometers 118 measure the temperature of the substrate W or the susceptor 150 from the outside of the film deposition chamber 110. The measured temperature values are sent to the heater 115 etc. for the feedback and used to control the temperature of the substrate W.

The evacuation part 119 is disposed in a lower portion of the film deposition chamber 110 to discharge the gas within the film deposition chamber 110. The evacuation part 119 is connected to a vacuum pump and an evacuation mechanism that are not shown, and discharges the gas used to form the film to the outside of the film deposition chamber 110.

FIGS. 3A and 3B are a plan view and a cross-sectional view showing an example of the structure of a first member 151 of the susceptor 150. FIG. 3B is a cross-sectional view taken along line B-B of FIG. 3A. FIGS. 4A and 4B are a plan view and a cross-sectional view showing an example of a second member 152 of the susceptor 150. FIG. 4B is a cross-sectional view taken along ling B-B of FIG. 4A.

The susceptor 150 includes the first member 151 and the second member 152. The second member 152 is placed on the first member 151 so as to cover (close) an opening OP of the first member 151.

The first member 151 and the second member 152 thus function as a single susceptor 150. As shown in FIG. 2, the susceptor 150 may be placed on the support 111 in the film deposition chamber 110, and the substrate W may be placed on the susceptor 150.

The outer shape of the first member 151 is substantially circular and concentric with the substrate W, as shown in FIG. 3A. The opening OP is formed in a central portion of the first member 151. The shape of the opening OP may be, for example, substantially triangular when viewed from above the substrate mounting surface of the susceptor 150.

The first member 151 has a counterbore 151a for holding the substrate W, and a counterbore 151b for holding the second member 152. As shown in FIG. 3B, the counterbore 151a is recessed from a top surface F151a of an edge portion toward a back surface F151b of the first member 151 and is formed in a stepwise manner. As shown in FIG. 3A, the counterbore 151a has a substantially circular shape and is concentric with the substrate W when viewed from above the substrate mounting surface, like the outer shape of the first member 151. The diameter of the counterbore 151a is slightly greater than that of the substrate W. The counterbore 151a therefore is capable of receiving the substrate W and holding the edge portion of the substrate W. The side surface of the counterbore 151a is in contact with the side surface of the substrate W, or very closely adjacent to the side surface of the substrate W. The counterbore 151a thus limits the horizontal movement of the substrate W and substantially defines the position of the substrate W. As a result, when the susceptor 150 is rotated, the susceptor 150 may hold the substrate W in the counterbore 151a.

A bottom surface F151c that is further recessed from the counterbore 151a is spaced apart from the back surface of the substrate W, and thus is not in contact with the substrate W. The counterbore 151a thus holds the edge portion of the substrate W.

As shown in FIG. 3B, the counterbore 151b is further recessed from the bottom surface F151c toward the back surface F151b to form a step. As shown in FIG. 3A, the counterbore 151b has a substantially triangular shape when viewed from above the substrate mounting surface, like the opening OP. As will be described later, the second member 152 also has a substantially triangular shape. The counterbore 151b, however, is slightly larger than the second member 152. The second member 152 therefore is received by the counterbore 151b, and an edge portion of the second member 152 is supported by the bottom of the counterbore 151b. The side surface of the second member 152 is in contact with the side surface of the counterbore 151b, or very closely adjacent to the side surface of the counterbore 151b. The counterbore 151b thus limits the horizontal movement of the second member 152, and defines the position of the second member 152. As a result, when the susceptor 150 is rotated, the second member 152 may be held on the counterbore 151b, covering the opening OP of the first member 151.

The back surface F151b of the first member 151 has a protrusion 151d. The protrusion 151d is in contact with the support 111 when the susceptor 150 is placed on the support 111.

As shown in FIG. 4A, the second member 152 has a substantially triangular shape, which is the same as or substantially similar to the shapes of the counterbore 151b and the opening OR A step 152a is formed at an edge portion of a back surface F152b of the second member 152. The step 152a faces the counterbore 151b. When the second member 152 is fitted to the first member 151, the step 152a is in contact with the counterbore 151b. This prevents the second member 152 from dropping out of the opening OP. The side surface of the step 152a faces the side surface of the counterbore 151b, and is in contact with or closely adjacent to the side surface of the counterbore 151b.

When the second member 152 is fitted into the first member 151, a surface F152a of the second member 152 is preferably substantially flush with the surface F151c of the first member 151 shown in FIG. 3A. The back surface F152b of the second member 152 is preferably substantially flush with the surface F151b of the first member 151. As a result, the susceptor 150 according to this embodiment has characteristics (such as radiation and thermal conductivity) that are substantially the same as the characteristics of a susceptor in which the first and second members 151 and 152 are integrally formed.

The opening OP and the second member 152 are substantially disposed in the central portion of the first member 151, and may substantially have a regular triangle shape. In this case, the second member 152 may be substantially evenly arranged on the first member 151. This makes it difficult for the second member 152 to drop out of the counterbore 151b. Since the second member 152 is substantially evenly arranged on the first member 151, the imbalance in temperature distribution of the substrate W may be prevented.

The first and second members 151 and 152 are preferably formed of the same material, which is, for example, SIC, carbon, or SIC-coated carbon.

Figure 5A:
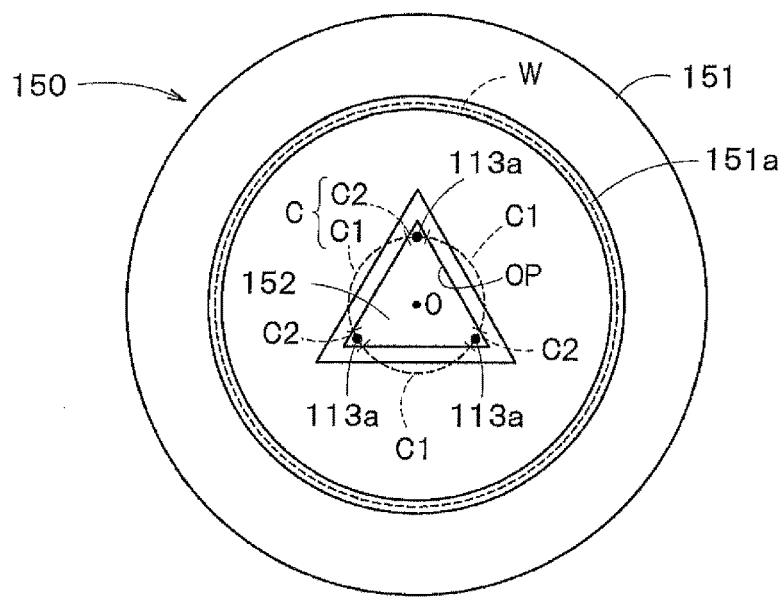
FIGS. 5A and 5B are plan views showing the positional relationship between the susceptor and the protrusions of the lift.
Figure 5B:
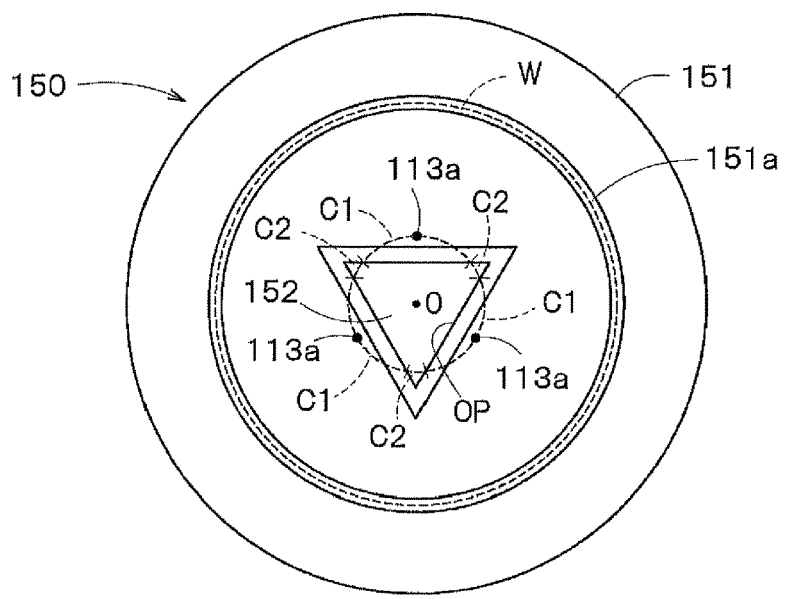

FIGS. 5A and 5B are plan views showing the positional relationship between the susceptor 150 and the protrusions 113a of the lift 113. The plan views of FIGS. 5A and 5B are viewed from above (or below) the substrate mounting surface of the susceptor 150. For the convenience of explanation, the substrate W is not illustrated but shown by a virtual line.

The lift 113 includes, for example, three protrusions (push-up pins) 113a, which push and move up, or move down the bottom surface of the susceptor 150. The shape of the figure drawn by connecting the apexes of the three protrusions 113a is substantially a triangle, which is substantially similar to the shape of the opening OP of the first member 151 and slightly smaller than the opening OP. If, therefore, the susceptor 150 is rotated from a reference position to a first phase so that the phases (rotation angles) of the apexes of the second member 152 match the protrusions 113a as shown in FIG. 5A and then the protrusions 113a are moved up, the protrusions 113a push up the bottom of the second member 152 of the susceptor 150. The lift 113 thus may move up the substrate W from the first member 151 together with the second member 152 in this manner. If, from the above state, the susceptor 150 is rotated to a second phase in which the protrusions 113a are placed below the first member 151 as shown in FIG. 5B, and then the protrusions 113a are moved up, the protrusions 113a push the bottom portion of the first member 151 of the susceptor 150. The lift 113 may move up the entire part of the susceptor 150 (the first and second members 151 and 152), or the entire part of the susceptor 150 together with the substrate W from the support 111 shown in FIG. 2.

Although the susceptor 150 together with the substrate W is rotated by the support 111 relative to the film deposition chamber 110, the lift 113 is not rotated. The state shown in FIG. 5A and the state shown in FIG. 5B therefore alternately occur. The member to be moved up by the lift 113 differs between the case where the susceptor 150 is stopped in the state shown in FIG. 5A (first phase) and the state shown in FIG. 5B (second phase).

A circle C, for example, may be drawn around a rotational center of the susceptor 150, the circle C being a conceptual circle connecting the apexes of the three protrusions 113a (circumscribing the three protrusions) that may be brought into contact with the member to be I moved up, and having a predefined diameter. The circle C may be said to be drawn around the rotational center O of the susceptor 150 and pass through the contact portions between the lift 113 and the susceptor 150. In other words, the three protrusions 113a of the lift 113 are disposed on the circumference of the circle C. The circle C overlaps the first member 151 in the first phase, and the second member 152 in the second phase that is different from the first phase.

The circle C has arcs each overlapping either of the first and second members 151 and 152 when the lift 113 is moved up to be in contact with the susceptor 150. If, for example, the circle C has first arcs C1 that overlap the first member 151, and second arcs C2 that overlap the second member 152, the first and second arcs C1 and C2 rotate in accordance with the rotation of the susceptor 150 and move along the circle C. The protrusions 113a of the lift 113 therefore alternately pass through the first arc C1 and the second arc C2, relatively, as the susceptor 150 rotates.

In the state shown in FIG. 5A, the protrusions 113a of the lift 113 are below the second arcs C2. In this case, the protrusions 113a of the lift 113 may be brought into contact with and push up the second member 152 without being in contact with the first member 151. As a result, the lift 113 moves up the second member 152 from the first member 151 and the support 111. The second member 152 is then removed from the first member 151 and moved up together with the substrate W.

In the state shown in FIG. 5B, the protrusions 113a of the lift 113 are below the first arcs C1. In this case, the protrusions 113a of the lift 113 may be brought into contact with the first member 151 without being in contact with the second member 152. As a result, the lift 113 moves up the entire part of the susceptor 150 (the first and second members 151 and 152) from the support 111.

As described above, the lift 113 moves up the entire part of the susceptor 150 or only the second member 152 (together with the substrate W) in accordance with the phase of the susceptor 150. In other words, the member to be moved up by the lift 113 changes in accordance with the phase of the susceptor 150.

The position at which the susceptor 150 stops may be controlled by the controller 170 shown in FIG. 2 by pulse controlling the rotating mechanism 160. For example, if the controller 170 causes the susceptor 150 to rotate once with 4800 pulses, the state shown in FIG. 5A and the state shown in FIG. 5B differ from each other by about 2400×(2n−1) pulses, where n is an integer greater than zero. Thus, the member to be moved up by the lift 113 may be switched between the entire part of the susceptor 150 and the second member 152 by shifting the position at which the susceptor 150 stops by 180 degrees.

The operation of the apparatus 1 while the substrate is being transferred will then be described.

Figure 6:
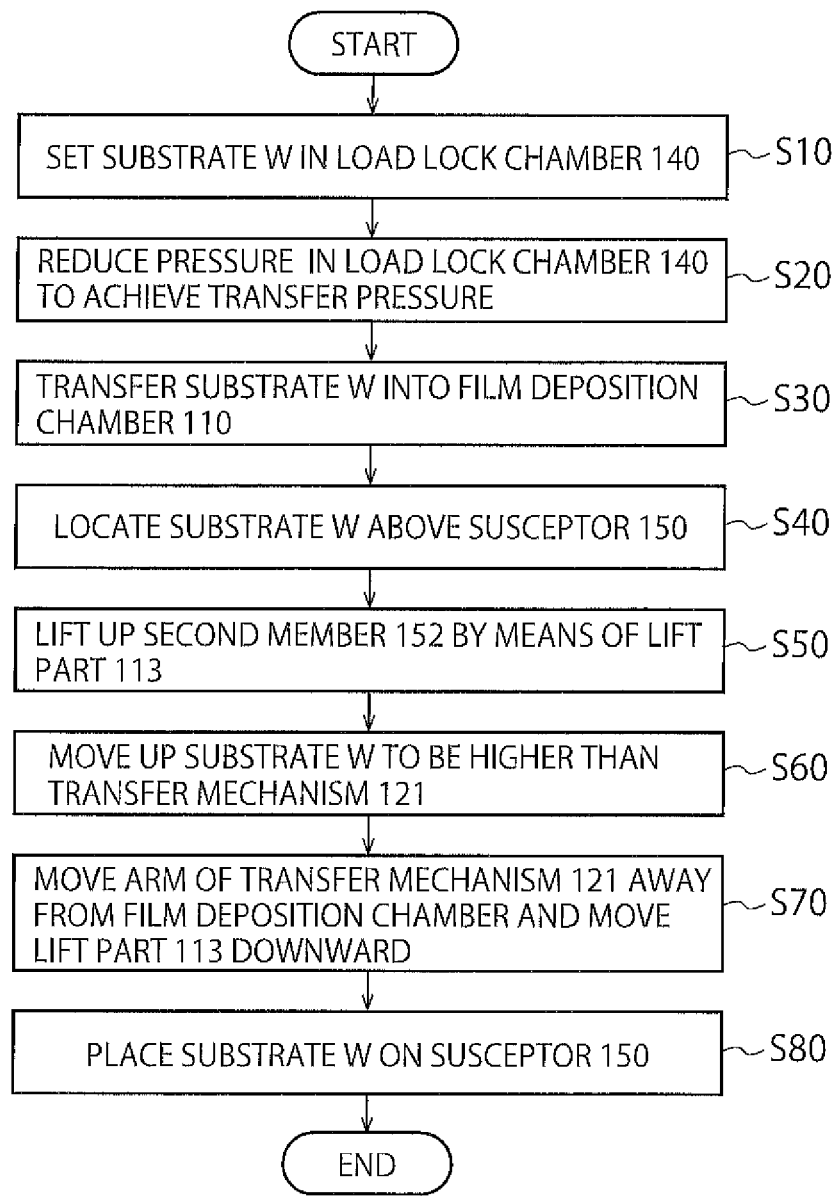
FIGS. 6 and 7 are flowcharts showing an example of the operation of the apparatus while the substrate is being transferred.
Figure 7:
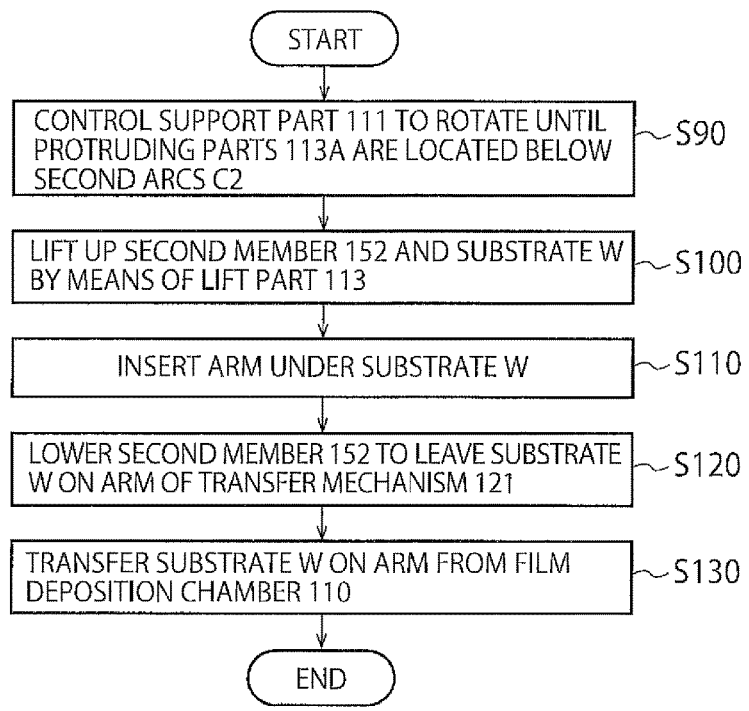

FIGS. 6 and 7 are flowcharts showing an example of the operation of the apparatus 1 while the substrate is being transferred. The operation for transferring the substrate W between the load lock chamber 140 and the film deposition chamber 110 shown in FIG. 1 will be described below.
(Transferring Substrate W from Load Lock Chamber 140 to Film Deposition Chamber 110: FIG. 6)

The substrate W is first set in the load lock chamber 140 (S10). The substrate W may be set by another robot arm that is not shown, or an operator.

The load lock chamber 140 is then vacuum drawn to a transfer pressure (S20).

The transfer mechanism 121 then transfers the substrate W from the load lock chamber 140 to the transfer chamber 120.

The transfer mechanism 121 transfers the substrate W into the film deposition chamber 110 (S30). When the substrate W is moved from the transfer mechanism 121 to the susceptor 150, the controller 170 shown in FIG. 2 controls the support 111 to rotate so that the protrusions 113a of the lift 113 are below the second arc C2 shown in FIG. 5A. As a result, the susceptor 150 stops in the state shown in FIG. 5A.

The transfer mechanism 121 then locates the substrate W above the susceptor 150 (S40).

Figure 8:
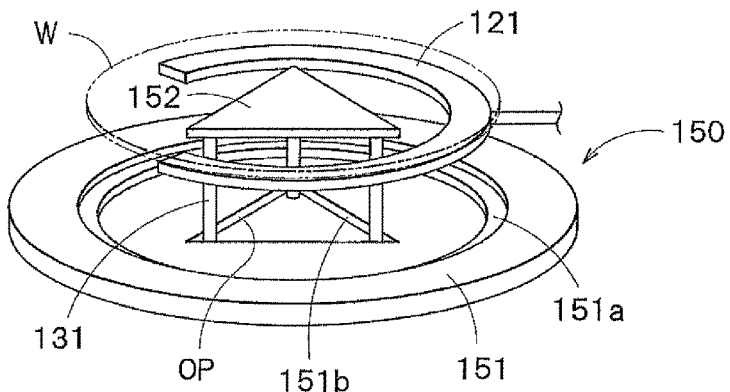
FIG. 8 is a schematic perspective view showing that a substrate is being placed on the susceptor in the film deposition chamber.

The driving mechanism 165 then causes the lift 113 to move up as shown in FIG. 8, to move up the second member 152 from the first member 151 and the support 111 (S50). FIG. 8 shows that the substrate W is being placed on the susceptor 150 in the film deposition chamber 110. The lift 113 moves up the second member 152 so that the second member 152 is in contact with the bottom portion of the substrate W to move up the substrate W to be higher than the arm of the transfer mechanism 121 (S60). As a result, the substrate W is placed on the second member 152, and removed from the arm of the transfer mechanism 121. At this time, the lift 113 moves up the substrate W via the second member 152 without being in contact with the substrate W. The arm of the transfer mechanism 121 has a U-shape or an arc shape having an internal diameter that is larger than the second member 152 so as not to interfere with the second member 152 and the lift 113.

The transfer mechanism 121 then moves the arm away from the film deposition chamber 110, and the driving mechanism 165 moves the lift 113 downward (S70). As a result, the second member 152 and the substrate W are moved to the first member 151. The second member 152 returns to the counterbore 151b, and the substrate W is received by the counterbore 151a. The substrate W is thus placed on the susceptor 150 (S80).

Thereafter, films are formed on the substrate W in the film deposition chamber 110.
(Transferring Substrate W from Film Deposition Chamber to Load Lock Chamber: FIG. 7)

When the substrate W is transferred from the film deposition chamber 110 to the load lock chamber 140, the controller 170 controls the support 111 to rotate until the protrusions 113a of the lift 113 are located below the second arcs C2 as shown in FIG. 5A (S90).

The driving mechanism 165 then moves up the lift 113 to move up the second member 152 and the substrate W from the first member 151 and the support 111 (S100).

The transfer mechanism 121 then inserts the arm under the substrate W (S110). This state is shown in FIG. 8.

The lift 113 then lowers the second member 152 to return to the counterbore 151b of the first member 151. As a result, the second member 152 is separated from the substrate W, which is left on the arm of the transfer mechanism 121 (S120).

The transfer mechanism 121 then transfers the substrate W on the arm from the film deposition chamber 110 to the load lock chamber 140 (S130).

The substrate W is then transferred from the load lock chamber 140.

Figure 9:
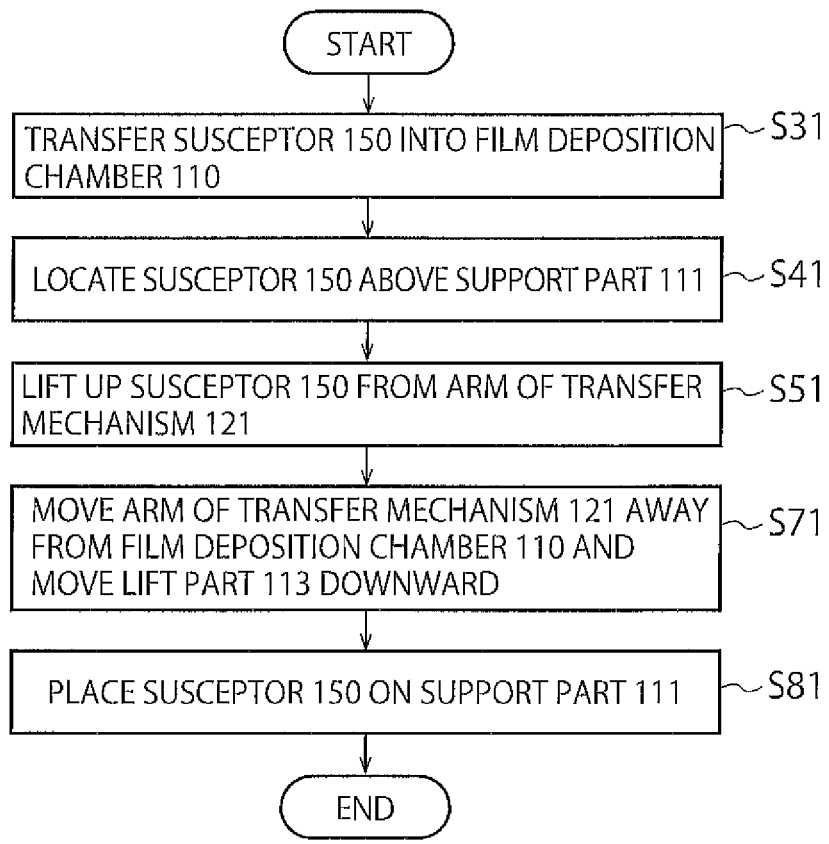
FIGS. 9 and 10 are flowcharts showing an example of the operation of the apparatus while the susceptor is being transferred.
Figure 10:
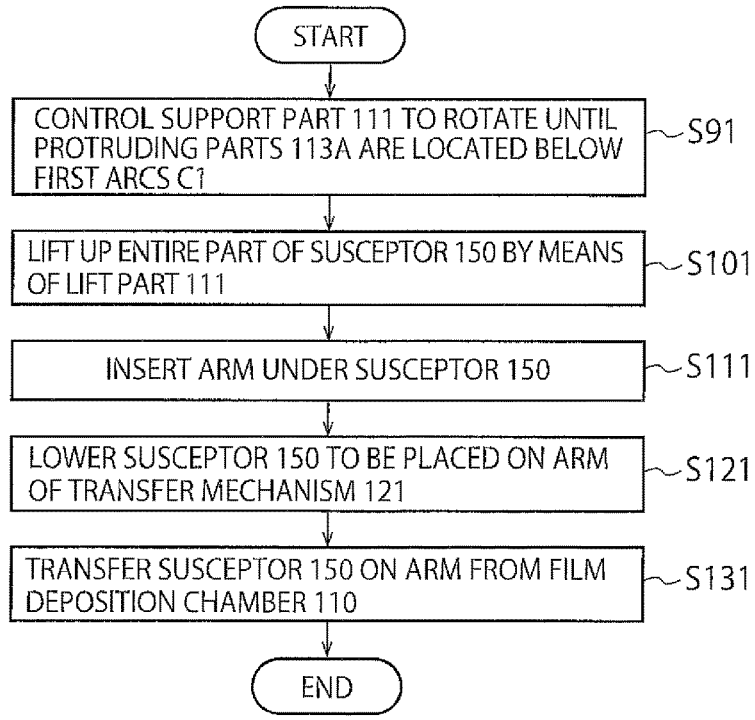

FIGS. 9 and 10 are flowcharts showing an example of the operation of the apparatus 1 while the susceptor is being transferred. The operation to transfer the susceptor 150 between the susceptor chamber 130 and the film deposition chamber 110 will be described below.
(Transferring Susceptor 150 from Susceptor Chamber 130 to Film Deposition Chamber 110: FIG. 9)

The susceptor 150 is in the susceptor chamber 130, and transferred from the susceptor chamber 130 to the film deposition chamber 110.

The transfer mechanism 121 transfers the susceptor 150 from the susceptor chamber 130 to the film deposition chamber 110 (S31). When the susceptor 150 is transferred from the transfer mechanism 121 to the support 111, the controller 170 controls the support 111 to rotate until the protrusions 113a of the lift 113 are located below the first arcs C1 as shown in FIG. 5B. As a result, the susceptor 150 stops in the state as shown in FIG. 5B.

The transfer mechanism 121 then locates the susceptor 150 above the support 111 (S41).

Figure 11:
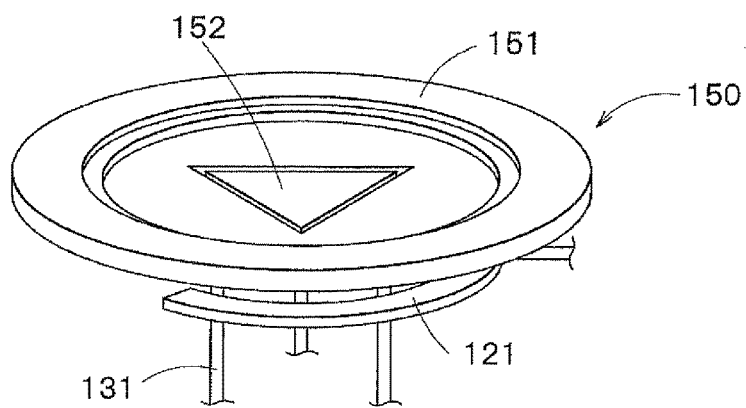
FIG. 11 is a schematic perspective view showing that the susceptor is placed on the support in the film deposition chamber.

The driving mechanism 165 then moves up the lift 113 to move up the susceptor 150 from the arm of the transfer mechanism 121 (S51). FIG. 11 shows that the susceptor 150 is placed on the support 111 in the film deposition chamber 110. The lift 113 moves up the first member 151 together with the second member 152 to locate the entire part of the susceptor 150 at a position above the arm of the transfer mechanism 121. As a result, the susceptor 150 is left on the protrusions 113a of the lift 113, and separated from the arm of the transfer mechanism 121. In order to move up the susceptor 150, the arm of the transfer mechanism 121 has a U shape or arc shape that is smaller than the susceptor 150.

The transfer mechanism 121 then moves the arm away from the film deposition chamber 110, and the driving mechanism 165 moves the lift 113 downward (S71). As a result, the susceptor 150 moves to the support 111. The susceptor 150 is placed on the support 111 (S81).

The susceptor 150 may be transferred to the film deposition chamber 110 with the substrate W. Alternatively, the susceptor 150 may be transferred separately from the substrate W, and then the substrate W may be placed on the susceptor 150 in the film deposition chamber 110.

(Transferring Susceptor 150 from Film Deposition Chamber 110 to Susceptor Chamber 130: FIG. 10)

When the susceptor 150 is transferred from the film deposition chamber 110 to the susceptor chamber 130, the controller 170 controls the support 111 to rotate until the protrusions 113a of the lift 113 are located below the first arcs C1 as shown in FIG. 5B (S91).

The driving mechanism 165 then moves up the lift 113 to move up the entire part of the susceptor 150 from the support 111 (S101).

The transfer mechanism 121 then inserts the arm under the susceptor 150 (S111). FIG. 11 shows this state.

The lift 113 then lowers the susceptor 150. As a result, the susceptor 150 is placed on the arm of the transfer mechanism 121 (S121).

The transfer mechanism 121 then transfers the susceptor 150 on the arm from the film deposition chamber 110 to the susceptor chamber 130 (S131).

As described above, the opening OP and the second member 152 located at the center of the susceptor 150 have a substantially triangular shape in this embodiment. As a result, the first arcs C1 of the circle C passing through points in each of the contact portions of the lift 113 and the susceptor 150 overlap the first member 151, and the second arcs C2 overlap the second member 152. When the protrusions 113a of the lift 113 are below the first arcs C1, the lift 113 is brought into contact with the first member 151 and moves up the entire part of the susceptor 150. In this case, the transfer mechanism 121 can transfer the entire part of the susceptor 150. If the second member 152 is not mounded on the first member 151, the lift 113 moves up only the first member 151. In this case, the transfer mechanism 121 can transfer only the first member 151. On the other hand, when the protrusions 113a of the lift 113 are below the second arcs C2, the lift 113 is brought into contact with the second member 152 and moves up the second member 152 from the first member 151. In this case, the transfer mechanism 121 can transfer only the substrate W. Thus, the apparatus 1 is capable of transferring the entire part of the susceptor 150, the first member 151, or the second member together with the substrate W by controlling the phase of the susceptor 150. In other words, the apparatus 1 is capable of arbitrarily selecting the object of the transfer operation based on the phase of the susceptor 150.

Thus, according to this embodiment, the substrate W may be placed on or removed from the susceptor 150 with the susceptor 150 being placed on the support 111 of the film deposition chamber 110. This prevents the center of the susceptor 150 from being displaced from the rotational center of the stage in the processing chamber 110. As a result, the susceptor 150 is prevented from dropping out of the stage while the substrate W is being processed, thereby preventing imbalance in the processing on the surface of the substrate W.

Second Embodiment

Figure 12A:
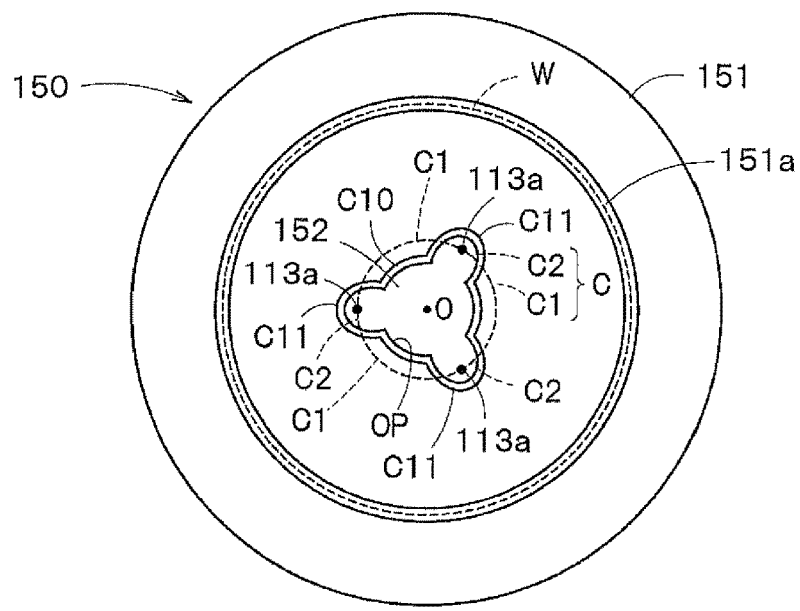
FIGS. 12A and 12B are plan views showing the positions of the susceptor and the protrusions of the lift according to a second embodiment.
Figure 12B:
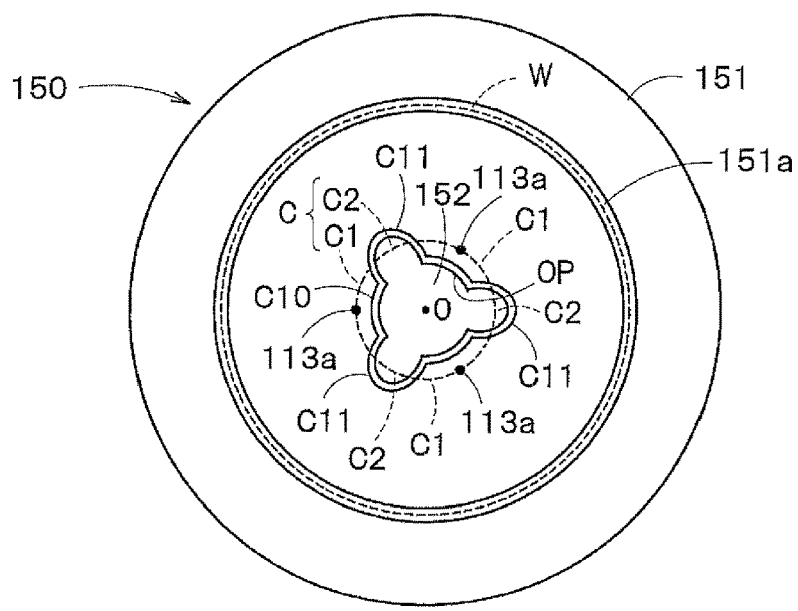

FIGS. 12A and 12B are plan views showing the positions of the susceptor 150 and the protrusions 113a of the lift 113 according to a second embodiment. The shape of the susceptor 150 according to the second embodiment differs from that of the first embodiment in the shapes of the second member 152 and the opening OP of the first member 151. The structure of the second embodiment may be the same as that of the first embodiment in the other portions.

In the second embodiment, the opening OP includes a substantially circular opening C10 and three cutout portions C11. The opening C10 is in a shape of a circle that is concentric with the circle C and smaller than the circle C.

Since the opening C10 is smaller than the circle C, the protrusions 113a may push up the first member 151 as shown in FIG. 12B. In this case, the lift 113 may move up the entire part of the susceptor 150 or the first member 151.

The cutout portions C11 are disposed to correspond to the protrusions 113a, and partially expand the opening C10 to be larger than the circle C. This allows the protrusions 113a to push up the second member 152 without being in contact with the first member 151 as shown in FIG. 12A. In this case, the lift 113 may push the substrate W together with the second member 152.

Figure 13:
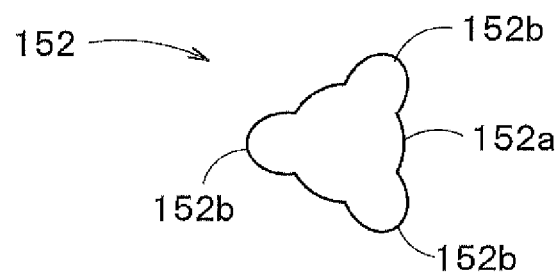
FIG. 13 is a plan view showing an example of the structure of the second member according to the second embodiment.

FIG. 13 is a plan view showing an example of the structure of the second member 152 according to the second embodiment. The shape of the second member 152 corresponds to that of the opening OP as shown in FIG. 13. The second member 152 includes a base member 152a having a substantially circular shape that is smaller than the circle C, and protruding portions 152b protruding from the base member 152a. The base member 152a is fitted to the opening C10, and the protruding portions 152b are fitted to the cutout portions C11. Thus, the second member 152 is fitted into the entire part of the opening OP.

As shown in FIGS. 12A and 12B, the circle C overlaps both the first and second members 151 and 152 when the susceptor 150 is viewed from above the substrate mounting surface. The circle C has, for example, first arcs C1 overlapping the first member 151, and second arcs C2 overlapping the second member 152. As the susceptor 150 rotates, the first and second arcs C1 and C2 move on the circle C. Thus, as the susceptor 150 rotates, the protrusions 113a of the lift 113 alternately pass portions below the first arcs C1 and portions below the second arcs C2, relatively.

When the protrusions 113a of the lift 113 are below the first arcs C1, the lift 113 may be brought into contact with the first member 151 and move up the entire part of the susceptor 150. In this case, the transfer mechanism 121 may transfer the entire part of the susceptor 150. If the second member 152 is not mounded on the first member 151, the lift 113 moves up only the first member 151. In this case, the transfer mechanism 121 can transfer only the first member 151. On the other hand, when the protrusions 113a of the lift 113 are below the second arcs C2, the lift 113 may be brought into contact with the second member 152 and move up the second member 152 from the first member 151. In this case, the transfer mechanism 121 may transfer the substrate W. Thus, the apparatus 1 according to the second embodiment is also capable of transferring the entire part of the susceptor 150 or only the substrate W by controlling the phase of the susceptor 150. Effects of the second embodiment are the same as those of the first embodiment.

In this embodiment, three protrusions 113a are provided to the lift 113. The number of protrusions 113a, however, may be four or more. The shapes of the second member 152 and the opening OP of the first member 151 are changed in accordance with the number of protrusions 113a. If, for example, the number of protrusions 113a is n (n is an integer of four or more), the opening OP may be a polygon having n apexes. Alternatively, the number of cutout portions C11 and the protruding portions 152b may be n.

The shapes of the opening OP and the second member 152 are not limited to those of the above embodiments. The shapes of the opening OP and the second member 152 may be arbitrarily determined as long as the entire part of the susceptor 150 of the only the substrate W may be transferred by controlling the position at which the susceptor 150 is stopped.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A substrate processing apparatus comprising:
a processing chamber;
a susceptor capable of supporting a substrate in the processing chamber, the susceptor including a first member having an opening in a central portion, and a second member covering the opening;
a support configured to support and rotate the susceptor in the processing chamber; and
a lift disposed in the support, and capable of moving up and down at least one of the first member and the second member, wherein the support is capable of rotating the susceptor to have predefined phases with respect to the lift,
when the lift moves up, the lift is brought into contact with the first member if the susceptor is in a first phase, and the lift is brought into contact with the second member if the susceptor is in a second phase that is different from the first phase,
the lift includes protrusions that are brought into contact with the first member or the second member when the lift moves up,
a circle passing through points in each of the protrusions includes first arcs overlapping the first member and second arcs overlapping the second member,
when the susceptor rotates relative to the lift, the protrusions alternately pass through portions below the first arcs and portions below the second arcs,
a shape formed by connecting apexes of the protrusions is substantially similar to a shape of the opening, and smaller than the opening,
the number of protrusions is three, and
the opening has a substantially triangular shape.

2. The apparatus according to claim 1, wherein when the susceptor is in the first phase, the lift moves up or down the first member, or the first member together with the second member, and
when the susceptor is in the second phase, the lift moves up or down the second member.

3. The apparatus according to claim 1, wherein:
the protrusions extend in a first direction substantially perpendicular to a substrate mounting surface of the susceptor and are disposed to be rotationally symmetric around a rotational center of the susceptor; and
the lift moves up at least one of the first member and the second member by the protrusions parts by moving the protrusions in the first direction.

4. The apparatus according to claim 1, wherein:
when the protrusions are below the first arcs, the protrusions are brought into contact with the first member without being in contact with the second member; and
when the protrusions are below the second arcs, the protrusions are brought into contact with the second member without being in contact with the first member.

5. A susceptor capable of supporting a substrate in a processing chamber of a substrate processing apparatus, the susceptor comprising:
a first member having an opening in a central portion; and
a second member covering the opening,
wherein a circle having a predefined diameter, a center of which is a rotational center of the susceptor, overlaps the first member in a first phase, and the second member in a second phase that is different from the first phase,
the substrate processing apparatus comprises:
the processing chamber;
a support configured to support and rotate the susceptor in the processing chamber; and
a lift disposed in the support, and capable of moving up and down at least one of the first member and the second member,
the support is capable of rotating the susceptor to have predefined phases with respect to the lift,
when the lift moves up, the lift is brought into contact with the first member if the susceptor is in a first phase, and the lift is brought into contact with the second member if the susceptor is in a second phase that is different from the first phase,
the lift includes protrusions that are brought into contact with the first member or the second member when the lift moves up,
the circle passing through points in each of the protrusions includes first arcs overlapping the first member and second arcs overlapping the second member,
when the susceptor rotates relative to the lift, the protrusions alternately pass through portions below the first arcs and portions below the second arcs,
a shape formed by connecting apexes of the protrusions is substantially similar to a shape of the opening, and smaller than the opening,
the number of protrusions is three, and
the opening has a substantially triangular shape.

6. The susceptor according to claim 5, wherein when a lift moves up the susceptor from below first arcs of the circle overlapping the first member, both the first member and the second member are moved up, and
when the lift moves up the susceptor from below second arcs of the circle overlapping the first member, the second member is lifted from the first member.

7. The susceptor according to claim 5, wherein the second member has a shape substantially similar to a shape of the opening.

8. The susceptor according to claim 7, wherein shapes of the second member and the opening are substantially triangular.

9. A transfer method for transferring a substrate to be placed and processed on a susceptor in a processing chamber of a substrate processing apparatus, the susceptor including a first member having an opening in a central portion and a second member covering the opening, and being supported by a support, the transfer method comprising:
transferring the susceptor into the processing chamber to have a first phase with respect to a lift disposed in the support, moving up the lift to place the susceptor on the lift, and lowering the lift to place the susceptor on the support;

rotating the susceptor to have a second phase relative to the lift, the second phase being different from the first phase; and after transferring the substrate into the processing chamber, moving up the second member together with the lift to place the substrate on the second member, and lowering the lift to place the substrate and the second member on the first member, wherein the substrate processing apparatus comprises:
the processing chamber;
the susceptor capable of supporting the substrate in the processing chamber;
the support configured to support and rotate the susceptor in the processing chamber; and
the lift disposed in the support, and capable of moving up and down at least one of the first member and the second member, the support is capable of rotating the susceptor to have predefined phases with respect to the lift, when the lift moves up, the lift is brought into contact with the first member if the susceptor is in a first phase, and the lift is brought into contact with the second member if the susceptor is in a second phase that is different from the first phase, the lift includes protrusions that are brought into contact with the first member or the second member when the lift moves up, a circle passing through points in each of the protrusions includes first arcs overlapping the first member and second arcs overlapping the second member, when the susceptor rotates relative to the lift, the protrusions alternately pass through portions below the first arcs and portions below the second arcs, a shape formed by connecting apexes of the protrusions is substantially similar to a shape of the opening, and smaller than the opening, the number of protrusions is three, and the opening has a substantially triangular shape.

10. The method according to claim 9, wherein:

when the susceptor is transferred, the lift moves up both the first member and the second member from the support; and when the substrate is transferred, the lift moves up the second member together with the substrate from the first member and the support.

* * * * *